(12) United States Patent
Yang et al.

(10) Patent No.: US 8,803,534 B2
(45) Date of Patent: Aug. 12, 2014

(54) CIRCUIT AND METHOD FOR SENSING A DIFFERENTIAL CAPACITANCE

(75) Inventors: Chao-Chi Yang, Hsinchu (TW); Shih-How Peng, Hsinchu County (TW)

(73) Assignee: Elan Microelectronics Corp., Hsinchu (TW)

(*) Notice: Subject to any disclaimer, the term of this patent is extended or adjusted under 35 U.S.C. 154(b) by 283 days.

(21) Appl. No.: 13/461,483

(22) Filed: May 1, 2012

(65) Prior Publication Data

US 2012/0280700 A1 Nov. 8, 2012

(30) Foreign Application Priority Data

May 5, 2011 (TW) .............................. 100115827 A

(51) Int. Cl.
*G01R 27/26* (2006.01)
(52) U.S. Cl.
USPC ........................................ 324/678; 324/679
(58) Field of Classification Search
USPC .................................................. 324/676–683
See application file for complete search history.

(56) References Cited

U.S. PATENT DOCUMENTS

2005/0134292 A1* 6/2005 Knoedgen ..................... 324/658

\* cited by examiner

*Primary Examiner* — Vincent Q Nguyen
(74) *Attorney, Agent, or Firm* — Muncy, Geissler, Olds & Lowe, P.C.

(57) ABSTRACT

A circuit for sensing a differential capacitance includes a charge-storing circuit to generate a first output voltage and a second output voltage related to capacitances at two terminals of the differential capacitance, respectively, an operational amplifier to amplify the difference between the first and second output voltages to generate a sensing value, a first sampling capacitor having one terminal connected to the negative input terminal and the other terminal receiving the first or second output voltage, and a second sampling capacitor having one terminal connected to the negative input terminal and the other terminal switched to the output terminal of the operational amplifier. The second sampling capacitor stores a non-ideal error value to offset the non-ideal effect of the operational amplifier imparted on the sensing value.

6 Claims, 10 Drawing Sheets

CIRCUIT AND METHOD FOR SENSING A DIFFERENTIAL CAPACITANCE

FIELD OF THE INVENTION

The present invention is related generally to a circuit and method for sensing a differential capacitance and, more particularly, to a circuit and method for sensing a differential capacitance capable of reducing the non-ideal effects of an operational amplifier imparted on the output sensing result.

BACKGROUND OF THE INVENTION

Differential capacitance is also referred to as electrode capacitance, which is the difference between the capacitances established at two electrodes. Sensors working thereupon have been developed and extensively used for sensing capacitive variations caused by physical factors, such as pressures, acceleration, linear displacement and rotational angles. While the circuit layouts may vary with practical sensing requirements, such sensors generally produce the sensing value according to the difference between the individual capacitances of two electrodes therein.

U.S. Pat. No. 6,949,937 has proposed a sensing circuit as depicted in FIG. 1, which includes a switched capacitor front-end 12 and an amplifier stage 14. A differential capacitance 10 is a capacitance between two electrodes and may be regarded as a combination of a pair of variable capacitors CT1 and CT2. The switched capacitor front-end 12 that includes a switching circuit 16 and a charge-storing circuit 18 is connected to the capacitors CT1 and CT2 at sensing terminals Input1 and Input2, respectively. By switching switches S1-S8 in the switching circuit 16, the capacitors CT1 and CT2 are connected to power sources VDD and VSS for supplying charges as desired. Then the charges of the capacitors CT1 and CT2 are repeatedly transferred to the capacitors C1 and C2 in the charge-storing circuit 18. Afterward, the charges of the capacitors C1 and C2 are stored into two terminals of a floating capacitor CD, so that the potential difference $V_{CD}$ between the two terminals of the capacitor CD is representative of the difference between the capacitances CT1 and CT2. At last, the two terminals of the capacitor CD are connected to the inputs of the amplifier stage 14, so that the amplifier stage 14 amplifies and then outputs the potential difference $V_{CD}$, thereby accomplishing measurement of the differential capacitance 10. FIGS. 2A-2E illustrate operation of the switched capacitor front-end 12 shown in FIG. 1. This art repeats operation as shown in FIGS. 2A-2D in an over-sampling manner without resetting switches SR1 and SR2, thereby repeatedly charging and discharging the capacitors CT1 and CT2, and repeatedly transferring the charges to the individual storing capacitor C1 or C2 inside the charge-storing circuit 18, so as to collect charge averages within the switched capacitor front-end 12 and in turn suppress RF interference or power source noises. Afterward, as shown in FIG. 2E, the charges of the capacitors C1 and C2 are stored to the two terminals of the capacitor CD, and then amplified and output by the amplifier stage 14 that is at the back-end part of FIG. 1 and connected to the two terminals of the capacitor CD. Since this art performs averaging measurement by repeatedly operating only the switched capacitor front-end 12 in the front-end part instead of repeatedly operating the entire circuit, it helps to reduce power consumption.

However, the amplifier stage 14 uses an operational amplifier to directly amplify the difference $V_{CD}$ between the corresponding output voltages $V_{OUT1}$ and $V_{OUT2}$, so the non-ideal effects of the operational amplifier, e.g. offset, flicker noise and finite gain error, are output through the output terminal of the operational amplifier as well, making the sensing performance deteriorated.

In addition, the above operation is not effective enough in noise reduction. Taking the capacitor C1 for example, according to the law of charge conservation, the output voltage after n rounds of charge transfer is determined as $$V_{OUT1} = V_n + V_{n-1} \cdot X + V_{n-2} \cdot X^2 + \ldots + V_1 \cdot X^{n-1}, \quad [\text{Eq-1}]$$

$$X = \frac{C1}{CT1 + CT2 + C1}, \quad [\text{Eq-2}]$$

$$V_{i,i=1\ldots n} = VDD_i \times \frac{CT1}{CT1 + CT2 + C1}, \quad [\text{Eq-3}]$$

where X is typically between 0.1 and 0.5, and VDDi may be regarded as incorporating RF interference and power source noises while the equivalent power source VDD varies over time. According to the equations Eq-1, Eq-2 and Eq-3, after n rounds of charge sampling and transfer, all the sampled results are affected by the factor X except for that of the n-th round. Since X<1, the earlier sampled result affects the final output less. In other words, $V_{OUT1}$ will approximate Vn, so the over-sampling operation under this configuration will not effectively average the sampled results to reduce noise.

SUMMARY OF THE INVENTION

An objective of the present invention is to provide a circuit for sensing a differential capacitance capable of reducing the non-ideal effects of an operational amplifier imparted on the output sensing result.

Another objective of the present invention is to provide a method for sensing a differential capacitance capable of reducing the non-ideal effects of an operational amplifier imparted on the output sensing result.

According to the present invention, a circuit for sensing a differential capacitance includes a pair of sensing terminals connected to two terminals of the differential capacitance, respectively, a switching circuit connected to the pair of sensing terminals for being switched to make the two terminals of the differential capacitance get connected to a high-voltage source or a low-voltage source or perform charge transfer, a charge-storing circuit coupled to the switching circuit for storing charges transferred from the differential capacitance in response to the switching of the switching circuit, to generate a first and second output voltages related to the capacitances at the two terminals of the differential capacitance, and an amplifier stage for generating a sensing value according to the difference between the first and second output voltages. The amplifier stage includes an operational amplifier having a positive input terminal connected to a common reference-voltage source, a first switch to receive the first output voltage, a second switch to receive the second output voltage, a first sampling capacitor having one terminal connected to a negative input terminal of the operational amplifier and the other terminal connected to the first and second switches, a third switch connected between the negative input terminal and an output terminal of the operational amplifier, and a second sampling capacitor having one terminal connected to the negative input terminal of the operational amplifier and the other terminal connected to the common reference-voltage source or the output terminal of the operational amplifier by a fourth and fifth switches.

According to the present invention, a method for sensing a differential capacitance switches to make two terminals of the differential capacitance get connected to a high-voltage source or a low-voltage source or perform charge transfer, stores charges transferred from the differential capacitance, generates a first and second output voltages related to the capacitances at the two terminals of the differential capacitance, simultaneously resets a sampling capacitor and stores a non-ideal error value of an operational amplifier at a negative input terminal of the operational amplifier into a second sampling capacitor, samples the first output voltage with the first sampling capacitor, further samples the second output voltage with the first sampling capacitor, connects the second sampling capacitor between the negative input terminal and an output terminal of the operational amplifier to generate a sensing value related to the difference between the first and second output voltages.

BRIEF DESCRIPTION OF THE DRAWINGS

These and other objectives, features and advantages of the present invention will become apparent to those skilled in the art upon consideration of the following description of the preferred embodiments of the present invention taken in conjunction with the accompanying drawings, in which.

DETAILED DESCRIPTION OF THE INVENTION

The amplifier stage of the present invention operates based on a pseudo correlated double sampling technique to input the sampled voltages by a front-end in different transfer rounds, and uses a capacitor to store an error value of the non-ideal characteristics of an operational amplifier to offset the non-ideal characteristics of the operational amplifier.

Figure 1:
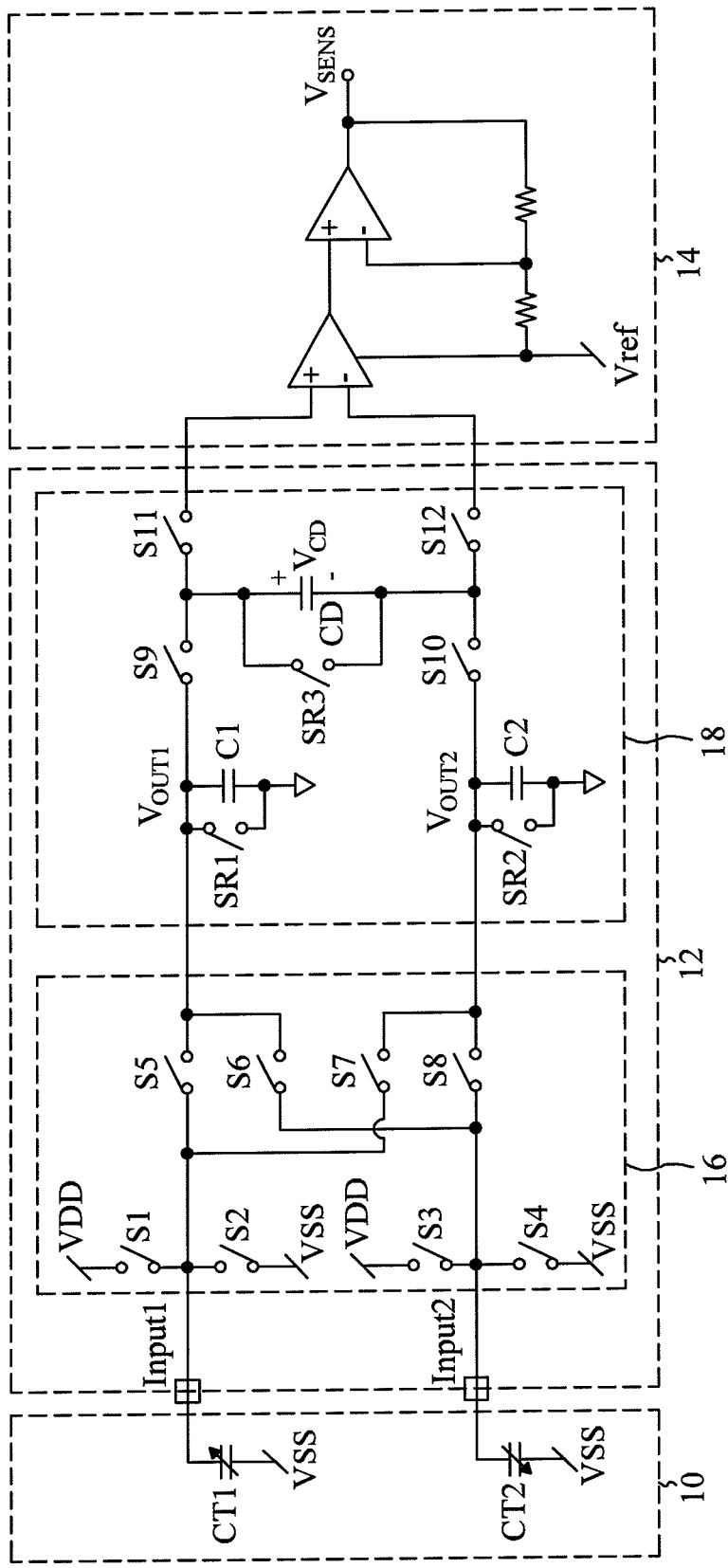
FIG. 1 is a conventional circuit for sensing a differential capacitance.
Figure 2A:
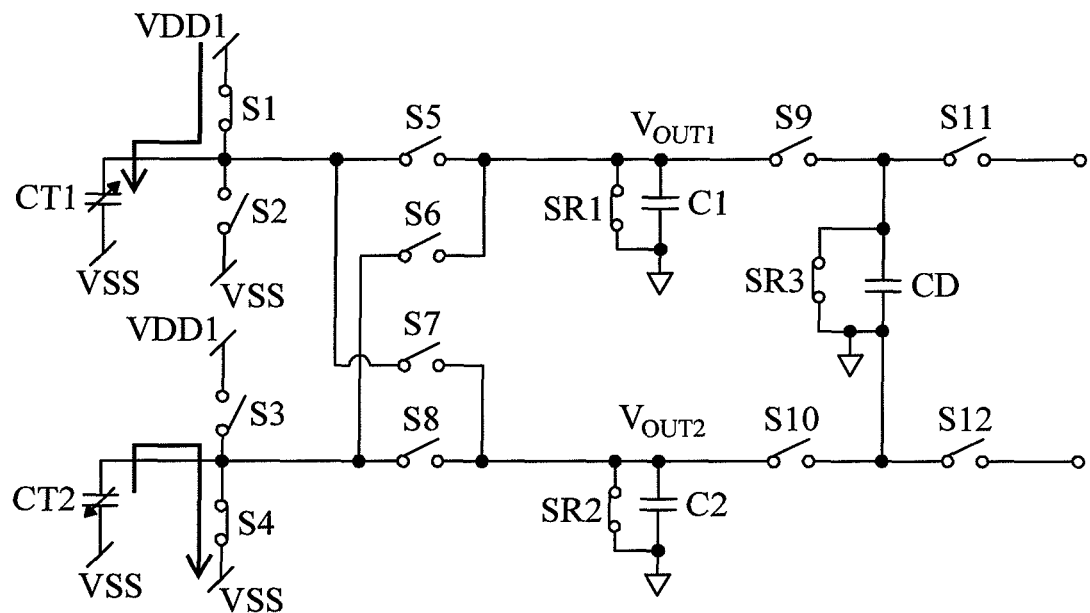
FIGS. 2A-2E illustrate operation of the switched capacitor front-end shown in FIG. 1.
Figure 2B:
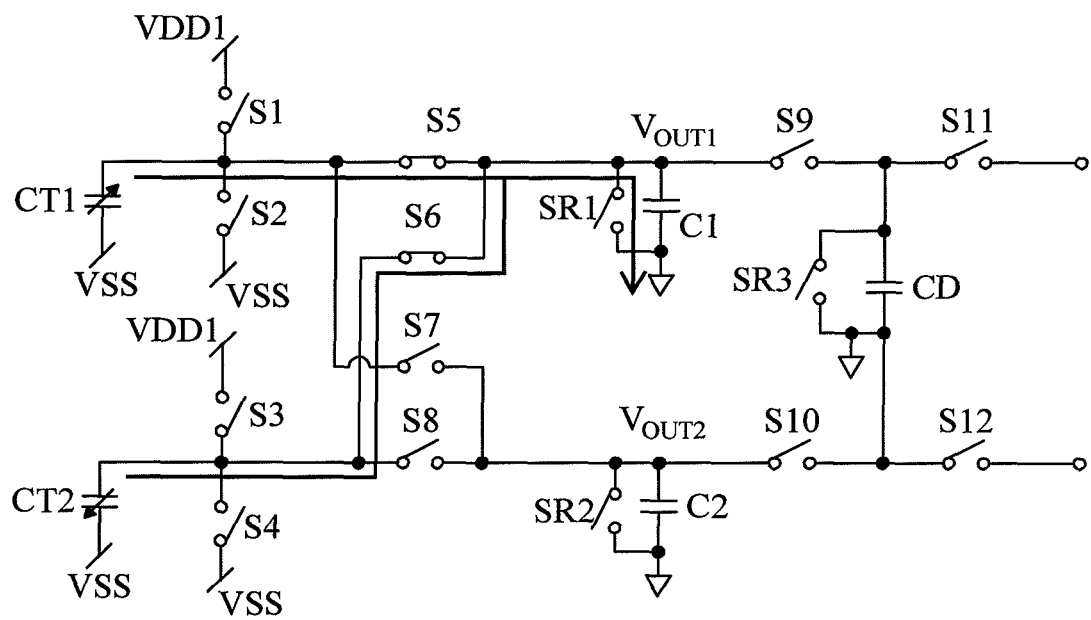
Figure 2C:
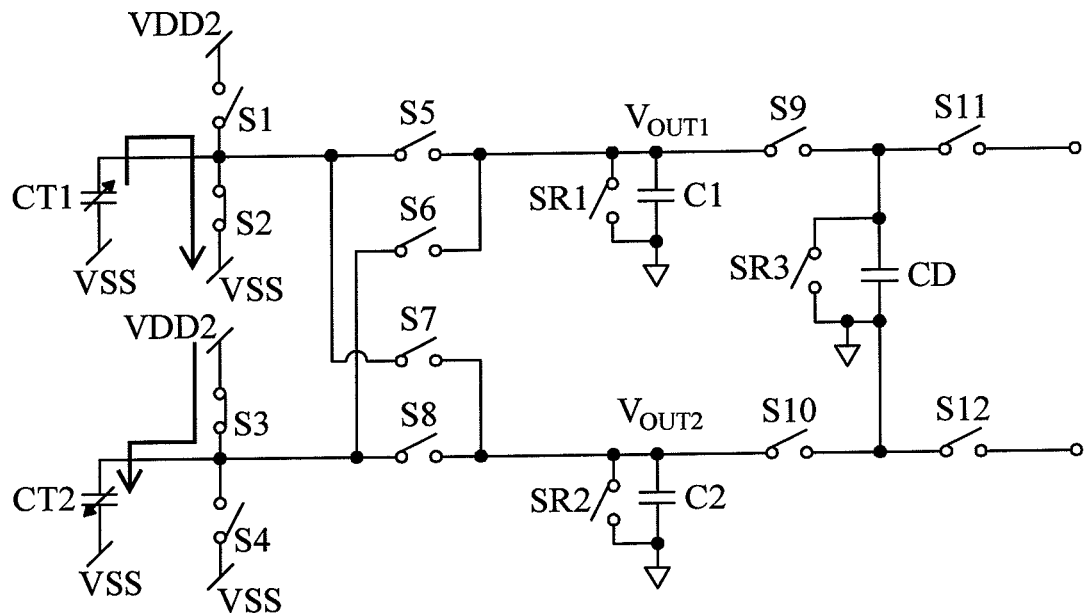
Figure 2D:
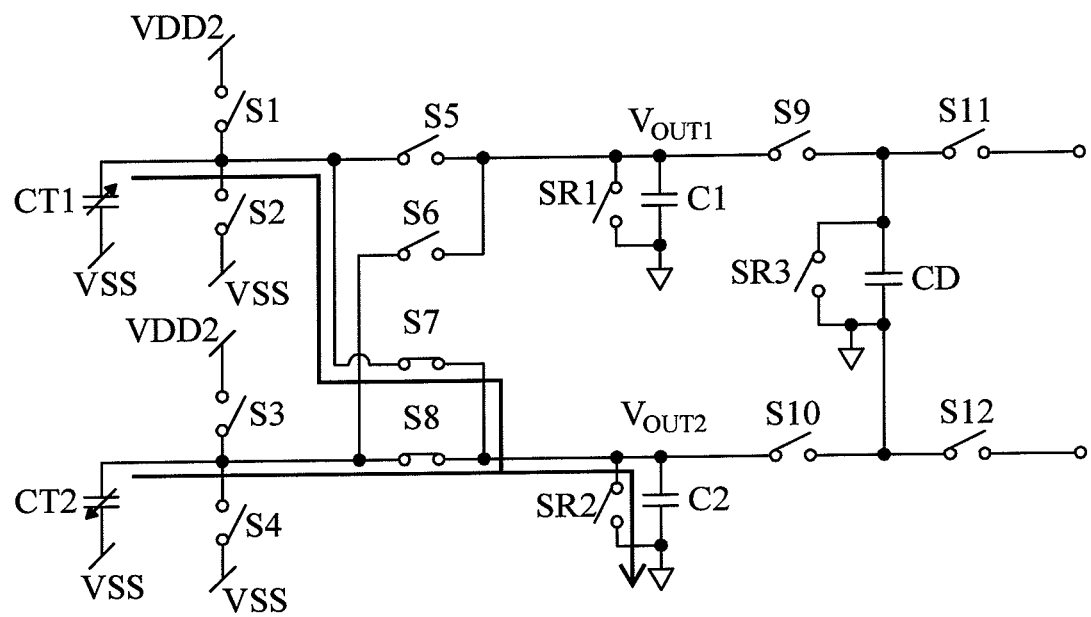
Figure 2E:
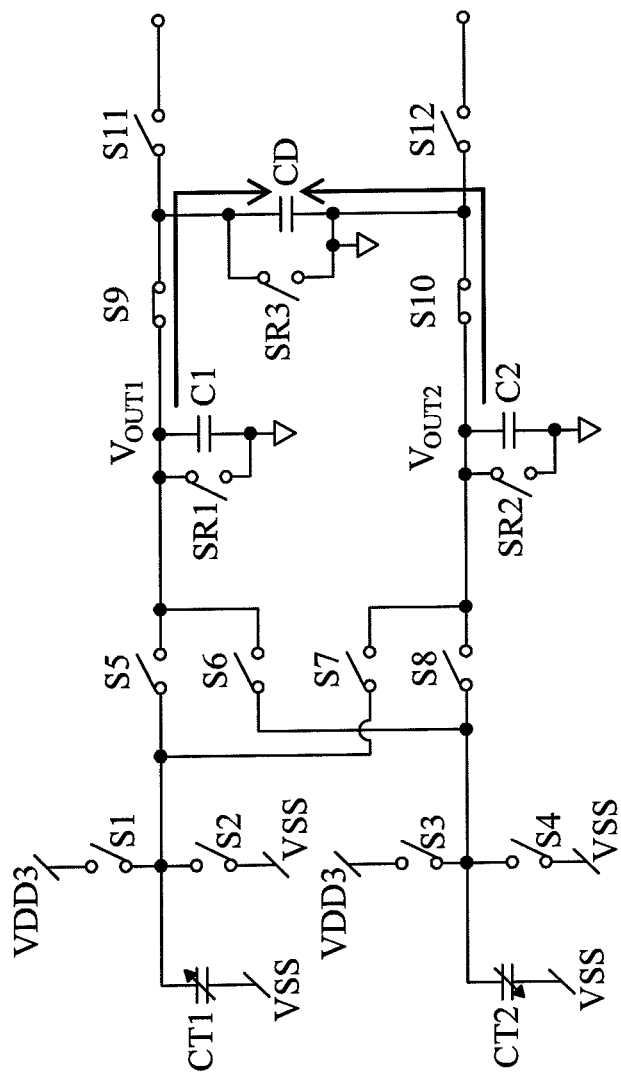
Figure 3:
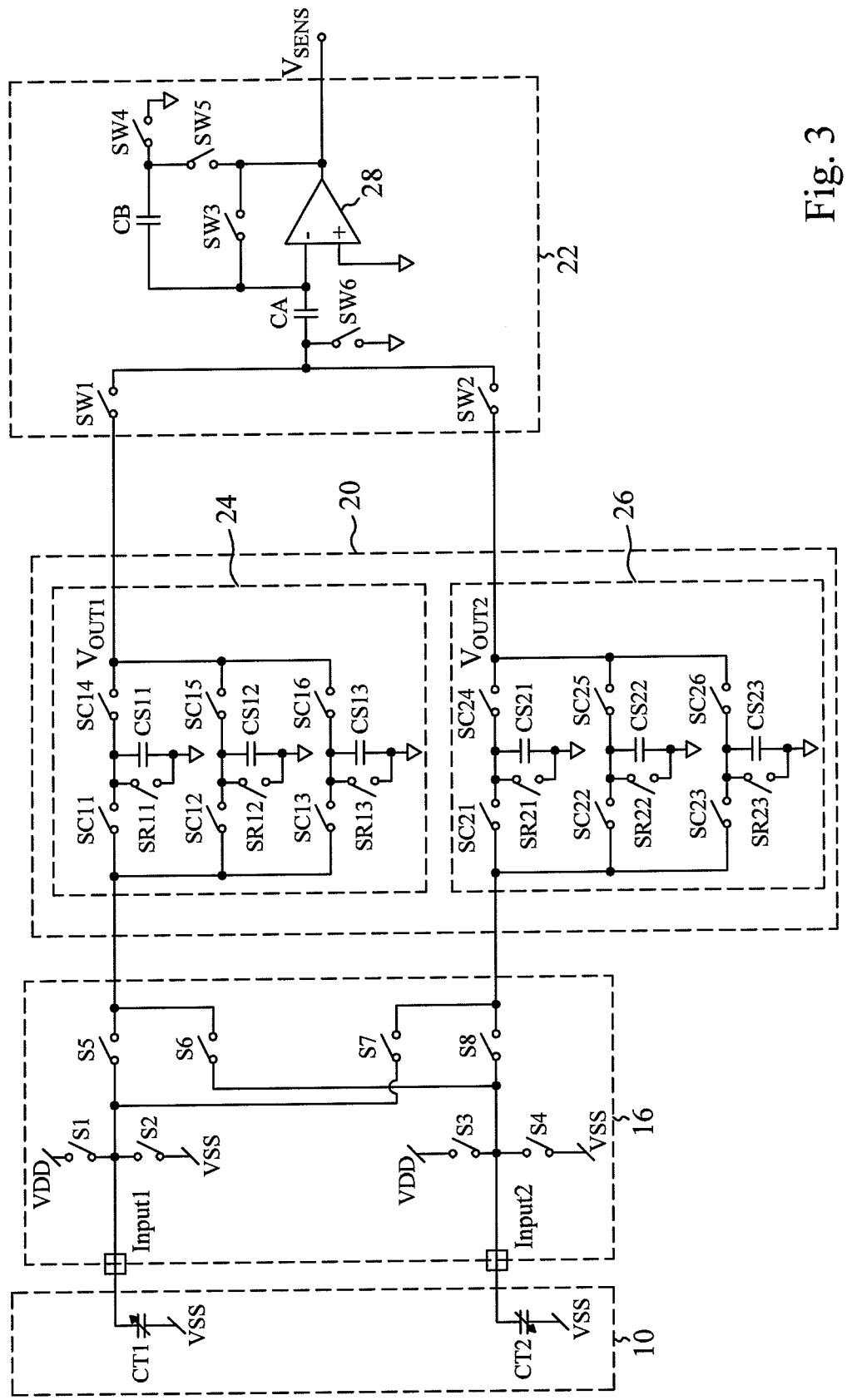
FIG. 3 is a first embodiment of a circuit for sensing a differential capacitance according to the present invention.
Figure 4A:
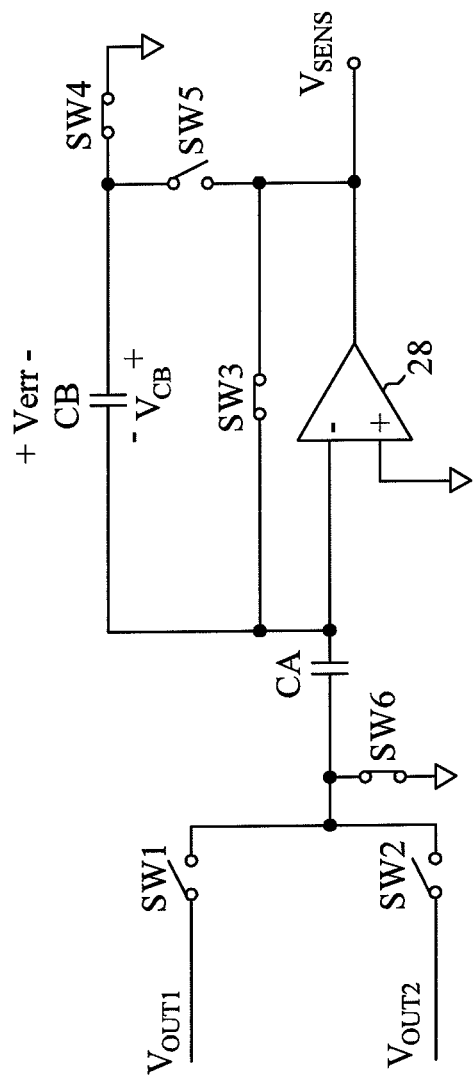
FIGS. 4A-4C illustrate operation of the amplifier stage shown in FIG. 3.
Figure 4B:
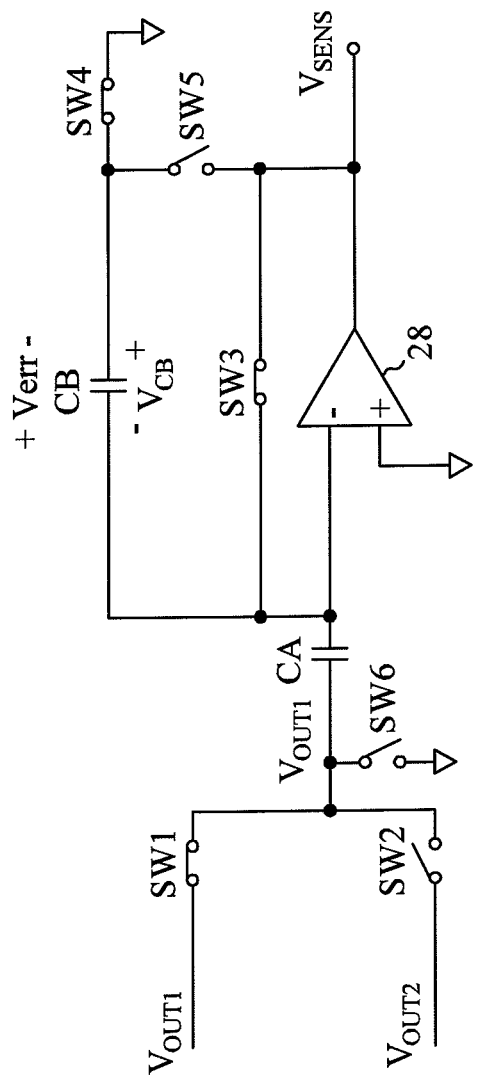
Figure 4C:
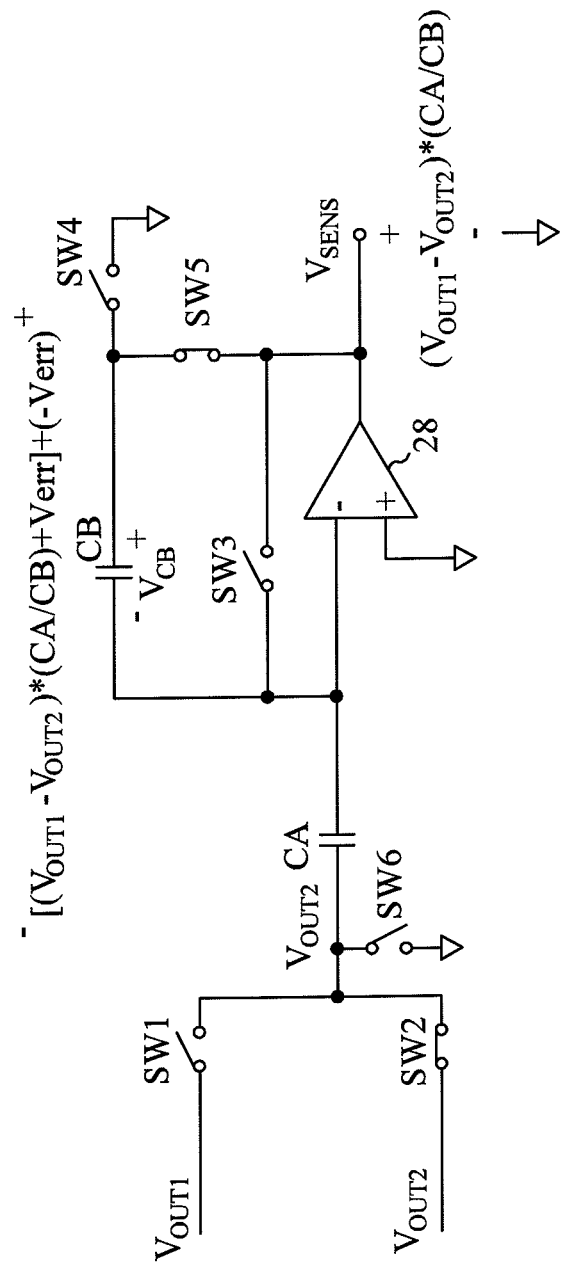

FIG. 3 is a first embodiment of a circuit for sensing a differential capacitance according to the present invention, which includes a switching circuit 16, a charge-storing circuit 20 and an amplifier stage 22. The charge-storing circuit 20 includes a plurality of storing capacitors. During operation, it uses switches to make the charges sampled in each transfer round stored into a different storing capacitor, and then connects all the storing capacitors in parallel for outputting, so as to average the sampled inputs and noises. The switching circuit 16 is connected to capacitors CT1 and CT2 at sensing terminals Input1 and Input2, respectively. By switching switches S1-S8 in the switching circuit 16, the capacitors CT1 and CT2 are connected to a low-voltage source or a high-voltage source. The charges of the capacitors CT1 and CT2 are repeatedly transferred to the charge-storing circuit 20, as shown in FIGS. 2A-2D. For all the embodiments described herein, the power source VSS is referred to as the low-voltage source and the power source VDD is referred to as the high-voltage source, which supply charges as desired. The charge-storing circuit 20 includes storing circuits 24 and 26 having a substantially same structure. The storing circuit 24 includes multiple capacitors CS11, CS12 and CS13. During operation, switches SC11, SC12 and SC13 make the charges transferred by the capacitor CT1 in different sampling rounds into different capacitors CS11, CS12 and CS13. At last, the switches SC14, SC15 and SC16 are turned on at a same time to connect all the capacitors CS11, CS12 and CS13 in parallel, so as to generate an output voltage $V_{OUT1}$. The storing circuit 26 includes multiple capacitors CS21, CS22 and CS23. During operation, switches SC21, SC22 and SC23 make the charges transferred by the capacitor CT2 in different sampling rounds into different capacitors capacitor CS21, CS22 and CS23. At last, the switches SC24, SC25 and SC26 are turned on at a same time to connect all the capacitors CS11, CS12 and CS13 in parallel, so as to generate an output voltage $V_{OUT2}$. The amplifier stage 22 includes an operational amplifier 28, switches SW1-SW6 and sampling capacitors CA and CB. The operational amplifier 28 has a positive input terminal connected to a common reference-voltage source. The switch SW1 is connected to the storing circuit 24 to receive the output voltage $V_{OUT1}$, and the switch SW2 is connected to the storing circuit 26 to receive the output voltage $V_{OUT2}$. The switch SW3 is connected between a negative input terminal and an output terminal of the operational amplifier 28. The sampling capacitor CA has one terminal connected to the negative input terminal of the operational amplifier 28, and the other terminal connected to the switches SW1 and SW2. The sampling capacitor CB has one terminal connected to the negative input terminal of the operational amplifier 28, and the other terminal connected to the switches SW4 and SW5, so that the sampling capacitor CB is connected to the common reference-voltage source or the output terminal of the operational amplifier 28. The switch SW6 is used to reset the sampling capacitor CA. In one embodiment, the power source VSS is used as the common reference-voltage source. In another embodiment, $$\frac{VDD - VSS}{2}$$

is used as the common reference-voltage source. FIGS. 4A-4C illustrate operation of the amplifier stage 22. At the beginning, as shown in FIG. 4A, the switch SW6 is first turned on to reset the sampling capacitor CA, and at the same time a non-ideal error value Verr at the negative input terminal of the operational amplifier 28 is stored into the sampling capacitor CB. Then, as shown in FIG. 4B, the switches SW1 and SW4 are turned on to sample the output voltage $V_{OUT1}$ by the sampling capacitor CA. At last, as shown in FIG. 4C, the switches SW2 and SW5 are turned on to make the sampling capacitor CB connected between the negative input terminal and output terminal of the operational amplifier 28, and sample the output voltage $V_{OUT2}$ by the sampling capacitor CA. After amplified by the amplifier stage 22, the voltage across the sampling capacitor CB is $V_{CB}=[(V_{OUT1}-V_{OUT2})\times(CA/CB)+Verr]+(-Verr)$, where the non-ideal error value Verr is neutralized by the non-ideal effect of the operational amplifier 28, and thus the sensing value $V_{SENS}=(V_{OUT1}-V_{OUT2})\times(CA/CB)$, which is only related to the difference between the output voltages $V_{OUT1}$ and $V_{OUT2}$.

Figure 5:
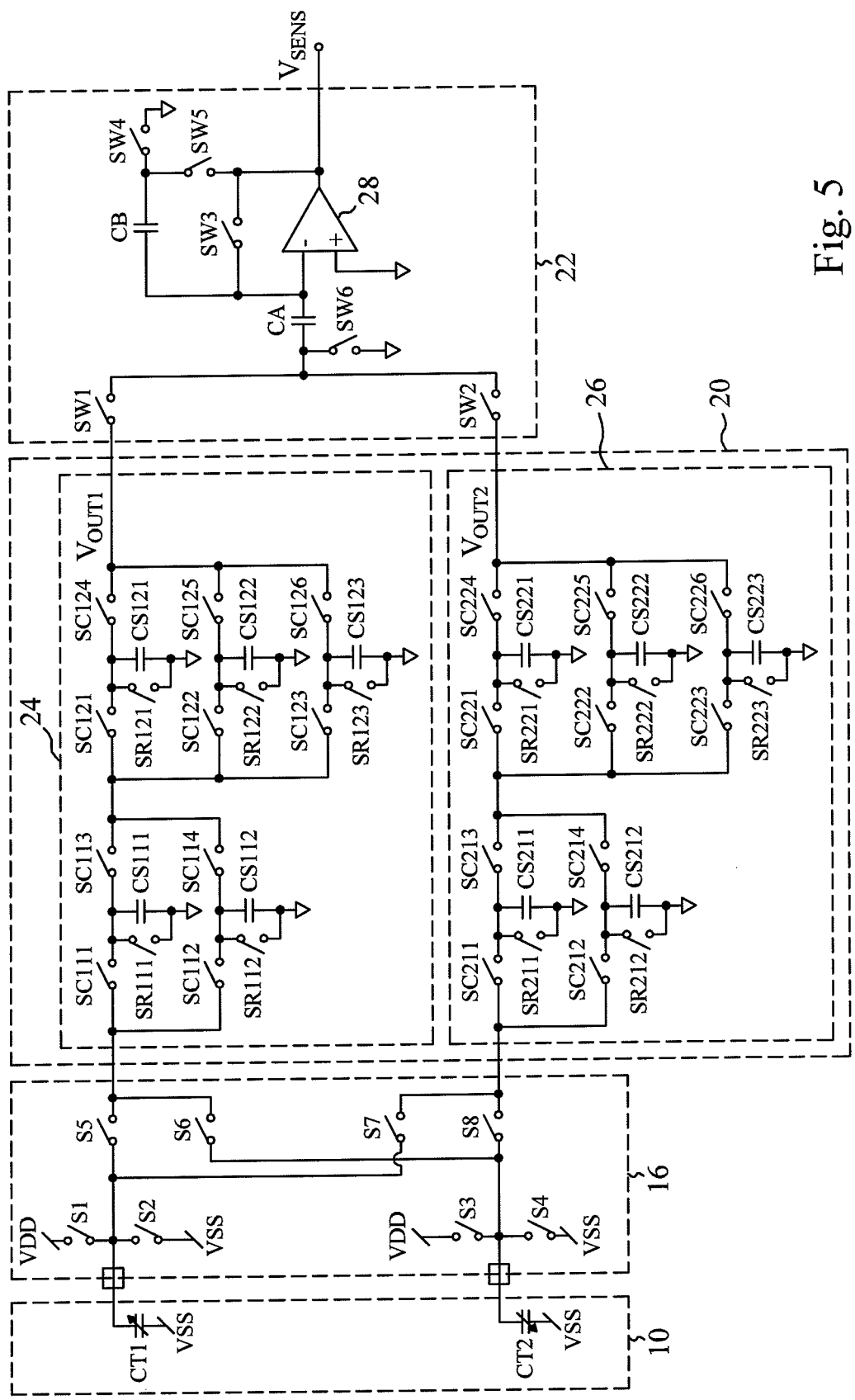
FIG. 5 is a second embodiment of a circuit for sensing a differential capacitance according to the present invention using a two-tier capacitor.

For separately storing the charges in different sampling rounds, the charge-storing circuit 20 may use a multi-tier storage approach. For example, as shown in FIG. 5, the charge-storing circuit 20 has two-tier structure, in which the storing circuits 24 and 26 have a substantially same structure, a two-tier storage structure. An example herein is that the storing circuit 24 repeatedly samples the capacitor CT1, as shown in FIGS. 2A-2B. The charges transferred in a first sampling round are stored into the capacitor CS111, and the charges transferred in a second sampling round are stored into the capacitor CS112. Afterward, the switches SC113 and SC114 are turned on to transfer the charges of the capacitors CS111 and CS112 to the capacitor CS121 for storage. Then the switches SR111 and SR112 are turned on to reset the capacitors CS111 and CS112. The third and fourth transfer rounds are performed in the same manner with the charges stored into the capacitor CS111 and CS112, respectively, before transferred to the capacitor CS122. The fifth and sixth transfer rounds are performed in the same manner with the charges stored into the capacitors CS111 and CS112, respectively, before transferred to the CS123. Then the switches SC124, SC125 and SC126 are turned on, so the output voltage $V_{OUT1}$ is the average of the 2×3=6 transfer rounds. The capacitor CT2 is sampled in the same manner. Sampling to the capacitor CT1 and the capacitor CT2 may be performed alternately, to further facilitate reducing noises. Operation of the foregoing multi-tier storage structure is described by referring to a two-tier storage structure constructed from N first-tier capacitors and M second-tier for repeatedly sampling the capacitor CT1 for n=N×M rounds. According to the law of charge conservation, the output voltage $$V_{OUT1} = ((V_n + V_{n-1} + \ldots + V_2 + V_1)/M) \times A, \quad [\text{Eq-4}]$$

$$V_{i,i=1 \ldots n} = VDD_i \times \frac{CT1}{CT1 + CT2 + CS1}, \quad [\text{Eq-5}]$$

$$A = \frac{CS1}{N \times CS1 + CS2}, \quad [\text{Eq-6}]$$

where CS1 is the common capacitance of all the first-tier capacitors, and CS2 is the common capacitance of all the second-tier capacitors. By applying the equations Eq-5 and Eq-6 to the equation Eq-4, it is found that the multi-tier storage structure such stores the transferred charges that the input signals and noises are effectively averaged, thereby reducing the impact of noises. Therefore, by designing the charge-storing circuit 20 as a multi-tier storing circuit, the output voltage is close to the average output voltage obtained by performing transfer rounds in the number equal to the product of the amount of capacitors in all the tiers of the multi-tier structure. In other embodiments, the charge-storing circuit 20 may be designed as a storing circuit with three or more tires in the same way.

Figure 6:
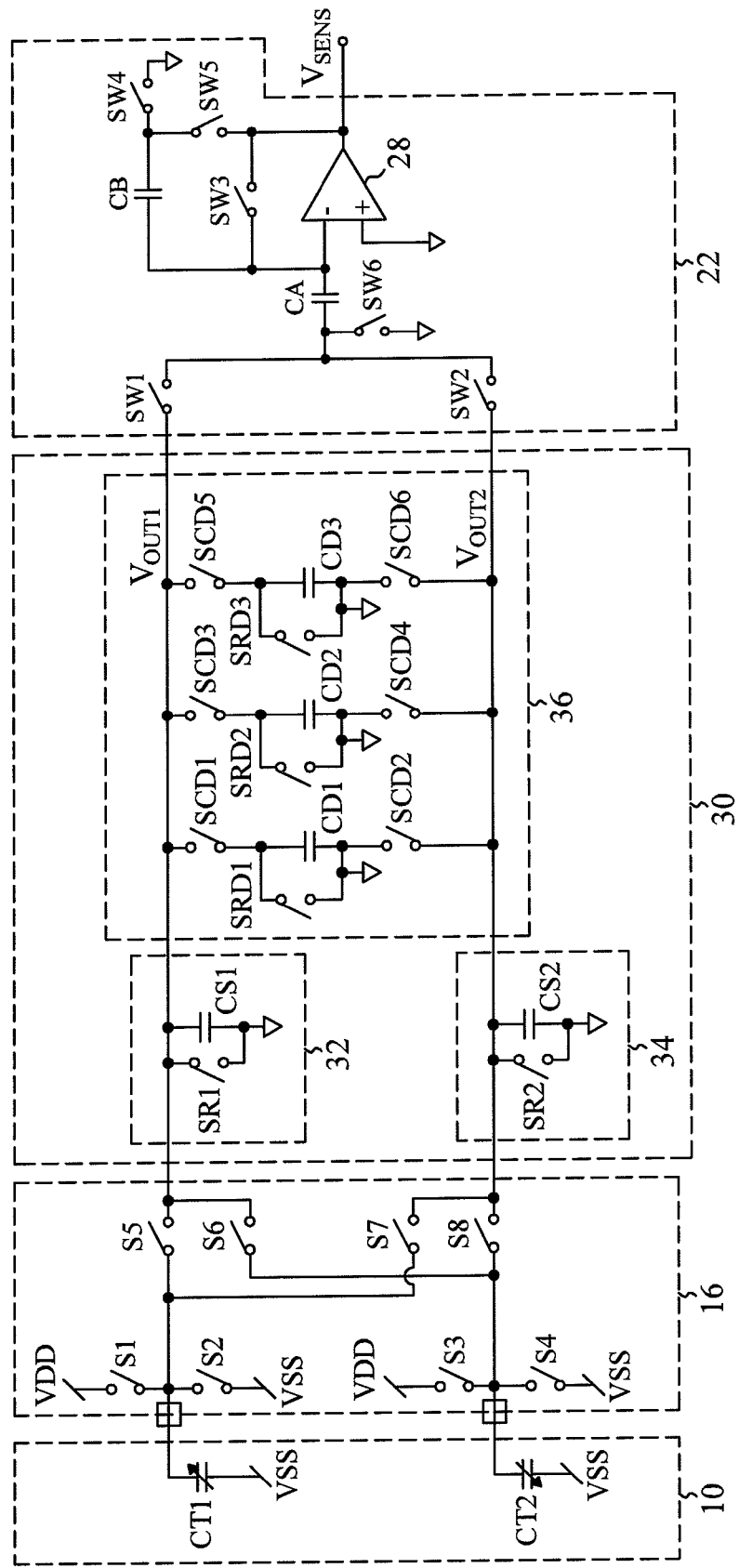
FIG. 6 is a third embodiment of a circuit for sensing a differential capacitance according to the present invention.

FIG. 6 is a third embodiment of the circuit for sensing a differential capacitance according to the present invention, which includes a switching circuit 16, a charge-storing circuit 30 and an amplifier stage 22. Similar to the embodiment of FIG. 3, the charge-storing circuit 30 also performs oversampling by using plural storing capacitors, but has three storing circuits 32, 34 and 36, wherein the principle of multiple storing capacitors is applied to the storing circuit 36 floated between the storing circuits 32 and 34. In this system, capacitors CS1 and CS2 in the storing circuits 32 and 34 sample capacitors CT1 and CT2, as shown in FIGS. 2A-2D. After the first transfer round, switches SCD1 and SCD2 are turned on to store charges into the capacitor CD1. Then the capacitors CS1 and CS2 are reset, so that the charges similarly sampled in the second transfer round are stored into the capacitor CD2. Again, the capacitors CS1 and CS2 are reset to make the charges sampled in the third transfer round stored into the capacitor CD3. At last, the capacitors CD1-CD3 are connected in parallel and output, so as to achieve even sampling between the inputs and noises. In other embodiments, the storing circuits 32 and 34 also have multiple storing capacitors or a multi-tier storing capacitor, as the storing circuit 24 or 26 shown in FIG. 3 or FIG. 5 so as to further improve the output.

While the present invention has been described in conjunction with preferred embodiments thereof, it is evident that many alternatives, modifications and variations will be apparent to those skilled in the art. Accordingly, it is intended to embrace all such alternatives, modifications and variations that fall within the spirit and scope thereof as set forth in the appended claims.

What is claimed is:

1. A method for sensing a differential capacitance, comprising steps of:
    A.) switching switches to make two terminals of the differential capacitance get connected to a high-voltage source or a low-voltage source or perform charge transfer;
    B.) storing charges transferred from the differential capacitance to generate a first output voltage and a second output voltage related to capacitances at the two terminals of the differential capacitance;
    C.) simultaneously resetting a first sampling capacitor and storing a non-ideal error value at a negative input terminal of an operational amplifier into a second sampling capacitor;
    D.) sampling the first output voltage with the first sampling capacitor;
    E.) sampling the second output voltage with the first sampling capacitor; and
    F.) connecting the second sampling capacitor between the negative input terminal and an output terminal of the operational amplifier to generate a sensing value related to a difference between the first and second output voltages.

2. The method of claim 1, wherein the step B comprises steps of:
    storing charges sampled at one of the terminals of the differential capacitance in different transfer rounds into different first storing capacitors; and
    storing charges sampled at the other terminal of the differential capacitance in different transfer rounds into different second storing capacitors.

3. The method of claim 2, further comprising steps of:
    connecting the plurality of first storing capacitors in parallel to generate the first output voltage; and
    connecting the plurality of second storing capacitors in parallel to generate the second output voltage.

4. The method of claim 2, wherein the step of storing charges sampled at one of the terminals of the differential capacitance in different transfer rounds into different first storing capacitors comprises steps of:
    storing the charges sampled in one of the rounds into one of first-tier capacitors; and
    storing charges of the parallel-connected first-tier capacitors in one of the rounds into one of second-tier capacitors.

5. The method of claim 2, further comprising a step of storing the charges stored in the first and second storing capacitors into two terminals of a third storing capacitor.

6. The method of claim 1, wherein the step B comprises steps of:
    storing charges at one of the terminals of the differential capacitance into a first storing capacitor;

storing charges at the other terminal of the differential capacitance into a second storing capacitor; and storing charges stored in the first and second storing capacitors in different transfer rounds into different third storing capacitors, and connecting the third storing capacitors in parallel as an assembly so that the first and second output voltages are generated at two terminals of the assembly.

* * * * *